(12) United States Patent
Shimizu

(10) Patent No.: US 8,903,879 B2
(45) Date of Patent: Dec. 2, 2014

(54) PROCESSING KALMAN FILTER

(71) Applicant: International Business Machines Corporation, Armonk, NY (US)

(72) Inventor: Junya Shimizu, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 248 days.

(21) Appl. No.: 13/622,411

(22) Filed: Sep. 19, 2012

(65) Prior Publication Data

US 2013/0080492 A1    Mar. 28, 2013

(30) Foreign Application Priority Data

Sep. 27, 2011    (JP) ................... 2011-210265

(51) Int. Cl.
*G06F 17/10*    (2006.01)
*H03H 17/02*    (2006.01)

(52) U.S. Cl.
CPC .................... *H03H 17/0257* (2013.01)
USPC ......................................................... 708/304

(58) Field of Classification Search
CPC .......... H03H 17/0263; H03H 17/0261; H03H 17/06; G06T 5/20; H04Q 11/00
USPC ......................................................... 708/304
See application file for complete search history.

(56) References Cited

U.S. PATENT DOCUMENTS

| 5,355,316 A   | * | 10/1994 | Knobbe ................... 701/507 |
| 6,456,671 B1  | * | 9/2002  | Patire ...................... 375/325 |
| 2013/0235484 A1 | * | 9/2013 | Liao et al. ................ 360/39 |

OTHER PUBLICATIONS

Julier, et al., "Unscented Filtering and Nonlinear Estimation," Proc. IEEE vol. 92, No. 3, pp. 401-422, Mar. 2004.
Wu, et al., "Unscented Kalman Filtering for Additive Noise Case: Augmented versus Nonaugmented," IEEE Signal Processing Letters, vol. 12, No. 5, pp. 357-360, May 2005.

* cited by examiner

*Primary Examiner* — Tan V. Mai
(74) *Attorney, Agent, or Firm* — Vazken Alexanian

(57) ABSTRACT

A method and system for processing Kalman Filter. The system includes: an Unscented Kalman Filter; and a processor device configured to: non-uniform a phase duration of a signal outputted from a plant; inputting the signal to the Unscented Kalman Filter; and restore non-uniformed phase duration of an estimated value calculated in the Unscented Kalman Filter to the phase duration.

13 Claims, 3 Drawing Sheets

US 8,903,879 B2

PROCESSING KALMAN FILTER

CROSS-REFERENCE TO RELATED APPLICATION

This application claims priority under 35 U.S.C. §119 from Japanese Patent Application No. 2011-210265 filed Sep. 27, 2011, the entire contents of which are incorporated herein by reference.

BACKGROUND OF THE INVENTION

1. Field of the Invention

The present invention relates to a processing technique for Kalman Filter. More particularly, the present invention relates to a technique of making improvement on an estimation error in the Kalman Filter.

2. Description of Related Art

A nonlinear state space model has been conventionally used as a model for designing a controller of a plant for an engine, control of the attitude of a satellite, a lithium ion battery, a fuel cell, and etc. The nonlinear state space model is complex as a whole, but it includes subsystems, where the subsystems' physical and chemical laws are known to some extent.

One generally estimates the internal states of the nonlinear state space model by linearly approximating a nonlinear function. Such method of linearly approximating a nonlinear function has employed a configuration based on Extended Kalman Filter (EKF).

However, the increase of model-based development lead to an increase of physical and chemical descriptions of a plant. As a result, there has been an increase of demand for development of a controller without unnecessary operation. In these circumstances, new challenges are presented, such as: providing a general framework of nonlinear system identification and state estimation that avoids a linear approximation and reflect properties of the plant in more detail; and providing a technique of designing a control system having high performance, which takes advantage of enhanced accuracy of the nonlinear system identification and state estimation.

To address such challenges, Unscented Kalman Filter (UKF) is proposed as a framework capable of handling a nonlinear function without approximation for a discrete system for which a Jacobian matrix or Hessian matrix cannot be calculated. UKF can also handle a wider error range of the first order approximation. It is known that the UKF can estimate better than the EKF can.

Further, it is known that augmented UKF has better accuracy than general filtering based on the state space model.

A conventional augmented UKF directly uses a nonlinear function representing plant characteristics and allows macro characteristics to be known, where the relative levels of frequency components can be known. However, the augmented UKF is based on the assumption that sampling for a filter update is performed at uniform timing. These conventional techniques do not consider that a temporal or frequency resolution can partly vary due to the nonlinear function.

SUMMARY OF THE INVENTION

Accordingly, one aspect of the present invention provides a method for processing Unscented Kalman Filter, the method including the steps of: setting, by a processor of a computer system, $$x_{k+1} = \bar{f}(x_k, k) + v_k, y_k = \bar{h}() + n_k$$

where: $x_k$ is an internal state; $y_k$ is output; $v_k$ is process noise for driving a system; $n_k$ is observation noise; $\bar{f}()$ is a first given nonlinear function; and $\bar{h}()$ is a second given nonlinear function; processing, by the processor, non-uniformed Unscented Kalman Filter to execute the steps of: non-uniforming a phase duration of the $x_k$ by a first real coefficient all-pass filter in which a numerator and a denominator of a transfer function for z transform are described as having a relationship between mirror image polynomials; and applying non-uniformed $x_k$ to $$x_{k+1} = \bar{f}(x_k, k) + v_k, y_k = \bar{h}(x_k, k) + n_k; \text{ and}$$

restoring, by the processor, non-uniformed phase duration of an estimated value of the $x_k$ calculated in the non-uniformed Unscented Kalman Filter to the phase duration by a second real coefficient all-pass filter in which a sign of a parameter in the first real coefficient all-pass filter is inverted.

Another aspect of the present invention provides a computer readable storage medium tangibly embodying a computer readable program code having computer readable instructions which when implemented, cause a computer to carry out the steps of a method including the steps of: setting, by a processor of a computer system, $$x_{k+1} = \bar{f}(x_k, k) + v_k, y_k = \bar{h}(x_k, k) + n_k$$

where: $x_k$ is an internal state; $y_k$ is output; $v_k$ is process noise for driving a system; $n_k$ is observation noise; $\bar{f}()$ is a first given nonlinear function; and $\bar{h}()$ is a second given nonlinear function; processing, by the processor, non-uniformed Unscented Kalman Filter to execute the steps of: non-uniforming a phase duration of the $x_k$ by a first real coefficient all-pass filter in which a numerator and a denominator of a transfer function for z transform are described as having a relationship between mirror image polynomials; and applying non-uniformed $x_k$ to $$x_{k+1} = \bar{f}(x_k, k) + v_k, y_k = \bar{h}(x_j, k) + n_k; \text{ and}$$

restoring, by the processor, non-uniformed phase duration of an estimated value of the $x_k$ calculated in the non-uniformed Unscented Kalman Filter to the phase duration by a second real coefficient all-pass filter in which a sign of a parameter in the first real coefficient all-pass filter is inverted.

Another aspect of the present invention provides a system including: an Unscented Kalman Filter; and a processor device configured to: non-uniform a phase duration of a signal outputted from a plant; inputting the signal to the Unscented Kalman Filter; and restore non-uniformed phase duration of an estimated value calculated in the Unscented Kalman Filter to the phase duration.

DETAILED DESCRIPTION OF THE PREFERRED EMBODIMENTS

Figure 1:
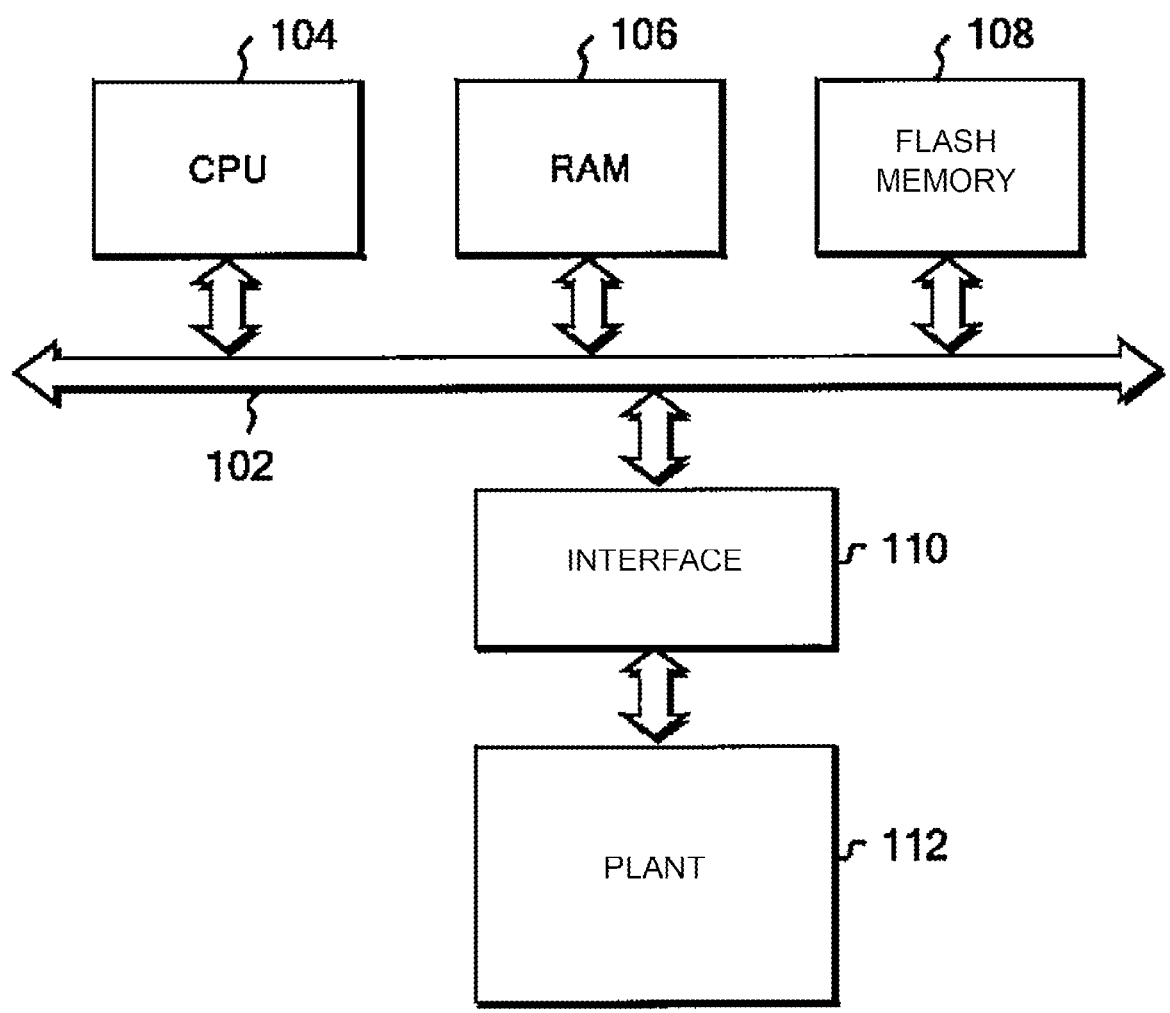
FIG. 1 is a schematic block diagram of a hardware configuration according to an embodiment of the present invention.

An embodiment of the present invention will be described below based on the drawings. The same components are denoted by the same reference numerals throughout the drawings, unless otherwise stated. It should be understood that the following describes one embodiment of the present invention and the embodiment is not intended to limit the present invention to the one described herein.

An object of the present invention is to provide a technique of improving the estimation accuracy in augmented UKF by using nonuniformed update timing, which considers plant characteristics for its determination.

In a system according to the present invention, a section to be identified by the system is preferably determined, and frequency analysis is performed on an observation signal (which can include noise) in the section. Then, according to the analysis result, a high-frequency component or a low-frequency component mainly targeted for phase nonuniformity is determined, and the determination result is reflected as a warp parameter.

In addition, the system according to the present invention is configured to achieve nonuniformed updates by inputting a signal to Kalman Filter through an all-pass filter in which a relationship between a numerator polynomial and a denominator polynomial is described as a relationship between mirror image polynomials. Thereby, the input reduces a computation amount that is different from re-sampling using a polyphase filter.

Further, in the system according to the present invention, an estimated state obtained by the Kalman Filter has a nonuniform phase duration if no processing is performed thereon. As such, the estimated state is filtered through inverse transformation of the nonuniformity.

It is difficult to achieve high accuracy in a non-linear model in the conventional augmented UKF. However, when augmented UKF using nonuniformed update timing according to the present invention is applied to the non-linear model, improvements were observed in both mean square error and average error distribution. In other words, the estimation accuracy can be improved when the augmented UKF for a non-linear model is used.

FIG. 1 is a schematic block diagram of a hardware configuration for implementing the present invention. The embodiment is a system configured to measure, as a signal, a state of a plant such as an engine, artificial satellite, a lithium ion battery, or a fuel cell. The system then executes processing of Kalman Filter which uses the measurement signal to estimate another measurement signal.

In particular, the present invention relates to UKF as a framework allowing a nonlinear function to be handled without approximation thereof, and more particularly relates to a system configured to execute augmented UKF.

In FIG. 1, a CPU 104, a main memory (RAM) 106, and a flash memory 108 are connected to a system bus 102. A plant 112 and various sensors (not shown) are further connected to the system bus 102 via a certain interface card 110 based on PCI, USB or the like.

For the CPU 104, any processor, such as Intel® 386EX, PowerPC or an ARM® architecture processor, which is suitable for an embedded system can be used.

The flash memory 108 stores an embedded operating system such as Linux (R), a module (corresponding to a block 204 in FIG. 2) configured to execute augmented UKF, modules (corresponding to blocks 202 and 206) configured to operate as all-pass filters, a module (not shown) configured to control input and output of data to and from the plant 112, a module (not shown) configured to control overall processing, and the like. The modules are loaded onto the main memory 106 at the start of the system or as necessary, and then are executed.

Figure 2:
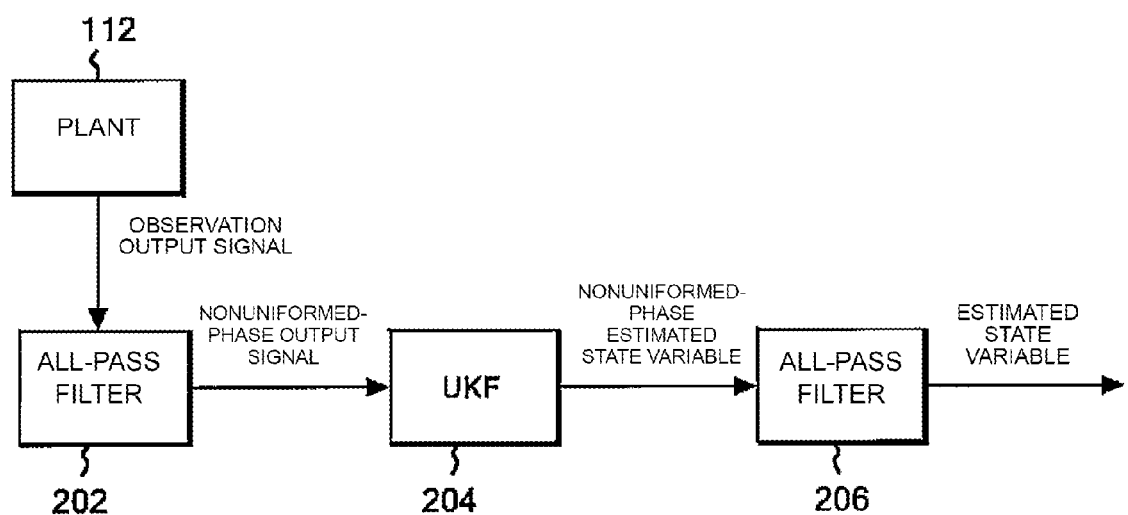
FIG. 2 is a schematic block diagram of a functional configuration according to an embodiment of the present invention.

FIG. 2 is a diagram of functional blocks for executing the processing of the present invention. The functional block 204 performs output estimation processing in accordance with processing described in the following formula:

$$x_{k+1} = \bar{f}(x_k, k) + v_k, y_k = \bar{h}(x_k, k) + n_k,$$ [Formula 1]

where $x_k$ is an internal state, $y_k$ is output, $v_k$ is process noise for driving the system, $n_k$ is observation noise, and $$\bar{f}(\ ), \bar{h}(\ )$$ [Formula 2]

represents given nonlinear functions for configuring a controller in consideration of physical or chemical properties and the like of the plant 112.

The present invention is characterized by the all-pass filter 202 and the all-pass filter 206.

In the all-pass filter 202, z transform is expressed to have a relationship between a numerator polynomial and a denominator polynomial described as a relationship between mirror image polynomials. The all-pass filter 202 nonuniforms the phase duration of the observation output signal from the plant 112 and then inputs the resultant signal to the UKF block 204.

The all-pass filter 206 can be substantially the same as the all-pass filter 202. However, parameters are set so that the all-pass filter 206 can perform an operation which is the inverse of that of the all-pass filter 202. That is, the all-pass filter 206 works so that the nonuniformed phase outputted from the UKF block 204 can be restored to the original phase.

Figure 3:
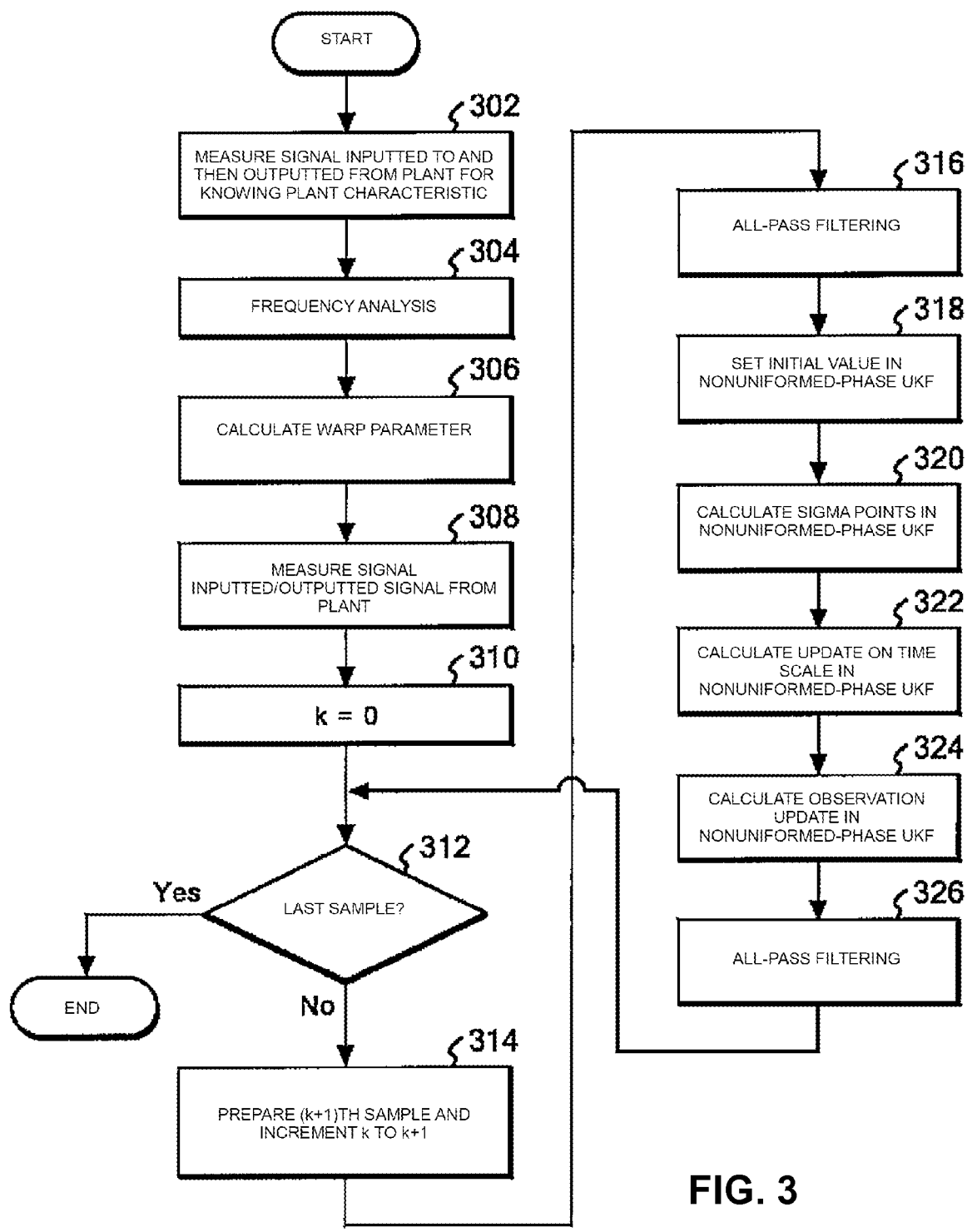
FIG. 3 is a flowchart illustrating an embodiment of the present invention.

Next, processing to be executed by the system shown in FIG. 1 in this embodiment will be described by referring to a flowchart in FIG. 3.

In Step 302, the system measures a signal inputted to and then outputted from the plant 112 via the interface 110 to know a characteristic of the plant 112.

In Step 304, the system performs a frequency analysis by using the measurement result to obtain values of a high-frequency component Hp and a low-frequency component Lp. At this time, the system determines a section to be identified by the system and performs a frequency analysis on an observation signal (noise can be included therein) in the section.

In Step 306, the system calculates a warp parameter A in accordance with the following formula:

$$\lambda = c \frac{Hp - Lp}{\max(Hp, Lp)},$$ [Formula 3]

where c is a positive constant appropriately determined so that $|\lambda| < 1$ holds true.

At this time, according to the analysis result, which of the high-frequency component Hp or the low-frequency component Lp is mainly targeted for that phase nonuniformity is determined, and the determination result is reflected as the warp parameter λ. For example, a power spectrum is obtained by FFT, and the above formula is used while a component lower than π/2 of a normalized angular frequency except a direct-current component is set as Lp and total sum of components higher than π/2 and equal to or less than IF is set as Hp. Since the frequency analysis is performed to know a tendency of the observation signal, a wavelet analysis can be used.

In Step 308, the system measures the signal inputted to and then outputted from the plant 112 via the interface 110.

In Step 310, the system sets a variable k to 0. In Step 312, the system determines whether or not the current sample is the last one. If Yes, the system ends the processing. If No, the system prepares a (k+i)th sample and increments k to k+1 in Step 314.

In Step 316, the system applies all-pass filtering described by using the following z transform formula to the prepared sample to nonuniform the phase thereof:

$$A(z^{-1}, \lambda) = \frac{-\lambda + z^{-1}}{1 - \lambda z^{-1}}. \quad \text{[Formula 4]}$$

In the above-described all-pass filtering formula, the z transform is expressed to have a numerator polynomial and a denominator polynomial described as having a relationship between mirror image polynomials. In particular, the above example shows the first-order filter equation.

More generally, an all-pass filter having an M-th causal real-coefficient is described as below:

$$A_M(z) = \pm \frac{z^{-M} D_M(z^{-1})}{D_M(z)}, \quad \text{[Formula 5]}$$

where $$D_M(z) = 1 + d_1 z^{-1} + \ldots + d_M z^{-M}. \quad \text{[Formula 6]}$$

In Formula 6, $d_1$ to $d_M$ are filter factors.

The following shows an example of a quadratic:

$$A(z^{-1}) = \frac{b + az^{-1} - z^{-2}}{1 + az^{-1} + bz^{-2}} \quad \text{[Formula 7]}$$

This embodiment uses the first-order equation. If A in the first-order all-pass filter is positive (negative), an effect can be obtained that the resolution is increased at points exhibiting a large number of high (low) frequency components.

More specifically, phase nonuniformity is performed on the observation signal in accordance with the following formula.

$$\hat{x}_{k_w}^w = \hat{x}_{k_w}^{(-)w} + K_{k_w}(A(z^{-1},\lambda)y_k - \hat{y}_{k_w}^{(-)w}) \quad \text{[Formula 8]}$$

The definition of the following coefficient:

$$K_{k_w} \quad \text{[Formula 9]}$$

will be described later with reference to Step 324.

In the following descriptions, w included in a superscript or a subscript denotes a variable of a warped (nonuniformed) region by the nonuniformed sampling, and a subscript w in a term related to time also denotes update timing in the region warped by the nonuniformed sampling. Moreover, a state required at a current time point k and estimation obtained by observing a covariance matrix or the like until a time point k−1 are denoted by a suffix "k|k−1," but can be in some cases substituted with a variable added with (−) on its shoulder. Besides, aw on the shoulder means a vector obtained in such a manner that a vector which has process noise and observation noise is obtained by redefining a state vector x as an extended state vector.

In Step 318, the system sets an initial value of the nonuniformed-phase UKF in accordance with the following formula:

$$\hat{x}_{0_w}^w = E[x_{0_w}], \quad P_{0_w}^w = E[(x_{0_w} - \hat{x}_{0_w}^w)(x_{0_w} - \hat{x}_{0_w}^w)^T] \quad \text{[Formula 10]}$$

$$\hat{x}_{0_w}^{a_w} = E[x_{0_w}^{a_w}] = \begin{bmatrix} \hat{x}_{0_w}^{wT} & 0 & 0 \end{bmatrix}^T \quad \text{[Formula 11]}$$

$$P_{0_w}^{a_w} = E[(x_{0_w}^{a_w} - \hat{x}_{0_w}^{a_w})(x_{0_w}^{a_w} - \hat{x}_{0_w}^{a_w})^T] = \begin{bmatrix} P_{0_w}^w & 0 & 0 \\ 0 & R^{v_w} & 0 \\ 0 & 0 & R^{n_w} \end{bmatrix}, \quad \text{[Formula 12]}$$

where $$x^{a_w} = [(x^w)^T \ (v^w)^T \ (n^w)^T]^T, \quad \text{[Formula 13]}$$
$$X^{a_w} = [(X^{X_w})^T \ (X^{v_w})^T \ (X^{n_w})^T]^T.$$

In addition, $$R^{v_w} \quad \text{[Formula 14]}$$

is a process noise covariance matrix in the nonuniformed sampling, and $$R^{n_w} \quad \text{[Formula 15]}$$

is an observation noise covariance matrix in the nonuniformed sampling.

In Step 320, the system calculates sigma points in the nonuniformed-phase UKF for each $k_w \in \{1, \ldots, \infty\}$ in accordance with the following formula. Meanwhile, the conventional UKF has proposed how to give appropriate sigma points near true values. In contrast, the present invention is characteristic also in a point that sigma points can be given according to the dynamics of the true values. Specifically, the following operations are performed to improve the estimation accuracy. For an observation signal assumed to have a rapid change in its true value, the update rate is increased to generate a larger number of patterns of sigma points. As for an observation signal assumed to have a slow change in its true value, the pattern change of sigma points is prevented to avoid too frequent updates.

$$X_{i,(k-1)_w}^{a_w} = \begin{cases} \hat{x}_{(k-1)_w}^{a_w}, & i = 0 \\ \hat{x}_{(k-1)_w}^{a_w} + \left(\gamma\sqrt{P_{(k-1)_w}^{a_w}}\right)_i, & i = 1, K, L \\ \hat{x}_{(k-1)_w}^{a_w} - \left(\gamma\sqrt{P_{(k-1)_w}^{a_w}}\right)_{i-L}, & i = L+1, K, 2L \end{cases} \quad \text{[Formula 16]}$$

In the formula above, (P)i is the i-th column, $$\gamma = \sqrt{L + \eta}, \quad \text{[Formula 17]}$$

η is a scaling parameter, and L is an order of an augmented vector shown below.

In addition, η=α2(L+μ)−L is set, and α=0.5, μ=3−L in the following example:

$$[(X_{i,(k-1)_w}^{X_w})^T (X_{i,(k-1)_w}^{v_w})^T (X_{i,(k-1)_w}^{n_w})^T]^T \quad \text{[Formula 18]}$$

In Step 322, the system performs a calculation for an update on a time scale in the nonuniformed-phase UKF in accordance with the following formulae. In Formula 19, f and h have been given in an augmented system by using equations of $x_k+1=f(x_k, v_k, k)$ and $y_k=h(x_k, n_k, k)$.

$$X^{x_w}_{k_w|(k-1)_w} = f[X^{x_w}_{(k-1)_w}, X^{v_w}_{(k-1)_w}]$$ [Formula 19]

$$\hat{x}^{(-)_w}_{k_w} = \sum_{i=0}^{2L} W_i^{(m)} X^{x_w}_{i,k_w|(k-1)_w}$$

$$P^{(-)_w}_{k_w} = \sum_{i=0}^{2L} W_i^{(c)} \left[X^{x_w}_{i,k_w|(k-1)_w} - \hat{x}^{(-)_w}_{k_w}\right]\left[X^{x_w}_{i,k_w|(k-1)_w} - \hat{x}^{(-)_w}_{k_w}\right]^T$$

$$Y^w_{k_w|(k-1)_w} = h[X^{x_w}_{k_w|(k-1)_w}, X^{n_w}_{(k-1)_w}]$$

$$\hat{y}^{(-)_w}_{k_w} = \sum_{i=0}^{2L} W_i^{(m)} Y^w_{i,k_w|(k-1)_w}$$

$$W_0^{(m)} = \frac{\eta}{L+\eta},$$ [Formula 20]

$$W_0^{(c)} = \frac{\eta}{L+\eta} + (1 - \alpha^2 + \beta)$$

In Formula 20, $\alpha$ and $\beta$ are any positive numbers.
In addition to this, the following is provided:

$$W_i^{(m)} = W_i^{(c)} = \frac{1}{2(L+\eta)}$$ [Formula 21]

In Step 324, the system performs a calculation for an observation update in the nonuniformed-phase UKF in accordance with the following formula.

$$P^w_{y_{k_w} y_{k_w}} =$$ [Formula 22]

$$\sum_{i=0}^{2L} W_i^{(c)} \left[Y^w_{i,k_w|(k-1)_w} - \hat{y}^{(-)_w}_{k_w}\right]\left[Y^w_{i,k_w|(k-1)_w} - \hat{y}^{(-)_w}_{k_w}\right]^T$$

$$P^w_{x_{k_w} y_{k_w}} = \sum_{i=0}^{2L} W_i^{(c)} \left[X^{k_w}_{i,k_w|(k-1)_w} - \hat{x}^{(-)_w}_{k_w}\right]\left[Y^w_{i,k_w|(k-1)_w} - \hat{y}^{(-)_w}_{k_w}\right]^T$$

$$K_{k_w} = P^w_{x_{k_w} y_{k_w}} P^w_{y_{k_w} y_{k_w}}{}^{-1}$$

$$\hat{x}^w_{k_w} = \hat{x}^{(-)_w}_{k_w} + K_{k_w}\left(A(z^{-1}, \lambda)y_k - \hat{y}^{(-)_w}_{k_w}\right)$$

$$P^w_{k_w} = P^{(-)_w}_{k_w} - K_{k_w} P^w_{y_{k_w} y_{k_w}} K_{k_w} T$$

$$A(z^{-1}, \lambda) = \frac{-\lambda + z^{-1}}{1 - \lambda z^{-1}}$$

In Step 326, the system restores the phase duration of the calculated signal amount to the original phase duration through all-pass filtering in accordance with the following formula.

$$\hat{x}_k = A(z^{-1}, -\lambda)\hat{x}_{k_w}^w$$ [Formula 23]

The system returns to Step 312 to determine whether or not the current sample is the last one. If Yes, the system ends the processing. If No, the system prepares a (k+i)th sample and increments k to k+1 in Step 314. Then, the system proceeds to Step 316.

The present invention has heretofore been described based on the specific embodiment. The present invention is not limited to the embodiment and makes it possible to improve the estimation accuracy of a signal in a control system for any plant to which the augmented UKF is applicable.

The above and other features of the present invention will become more distinct by a detailed description of embodiments shown in combination with attached drawings. Identical reference numbers represent the same or similar parts in the attached drawings of the invention.

As will be appreciated by one skilled in the art, aspects of the present invention can be embodied as a system, method or computer program product. Accordingly, aspects of the present invention can take the form of an entirely hardware embodiment, an entirely software embodiment (including firmware, resident software, micro-code, etc.) or an embodiment combining software and hardware aspects that can all generally be referred to herein as a "circuit," "module" or "system." Furthermore, aspects of the present invention can take the form of a computer program product embodied in one or more computer readable medium(s) having computer readable program code embodied thereon.

Any combination of one or more computer readable medium(s) can be utilized. A computer readable storage medium can be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium can include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium can be any tangible medium that can contain, or store a program for use by or in connection with an instruction execution system, apparatus, or device.

Computer program code for carrying out operations for aspects of the present invention can be written in any combination of one or more programming languages, including an object oriented programming language such as Java, Smalltalk, C++ or the like and conventional procedural programming languages, such as the "C" programming language or similar programming languages. The program code can execute entirely on the user's computer, partly on the user's computer, as a stand-alone software package, partly on the user's computer.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions can also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions can also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams can represent a module, segment, or portion of code, which includes one or more executable instructions for implementing the specified logical function(s). It should also be noted that, in some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method for processing Unscented Kalman Filter, the method comprising the steps of:

setting, by a processor of a computer system, $$x_{k+1} = \bar{f}(x_k, k) + v_k, y_k = \bar{h}(x_k, k) + n_k$$

wherein:
$x_k$ is an internal state;
$y_k$ is output;
$v_k$ is process noise for driving a system;
$n_k$ is observation noise;
$\bar{f}(\ )$ is a first given nonlinear function; and
$\bar{h}(\ )$ is a second given nonlinear function;
processing, by the processor, non-uniformed Unscented Kalman Filter to execute the steps of:
non-uniforming a phase duration of said $x_k$ by a first real coefficient all-pass filter in which a numerator and a denominator of a transfer function for z transform are described as having a relationship between mirror image polynomials; and
applying non-uniformed $x_k$ to $$x_{k+1} = \bar{f}(x_k, k) + v_k, y_k = \bar{h}(x_k, k) + n_k; \text{ and}$$

restoring, by the processor, non-uniformed phase duration of an estimated value of said $x_k$ calculated in said non-uniformed Unscented Kalman Filter to said phase duration by a second real coefficient all-pass filter in which a sign of a parameter in said first real coefficient all-pass filter is inverted.

2. The method according to claim 1, wherein said first real coefficient all-pass filter all-pass filter and said second real coefficient all-pass filter are first-order all-pass filters.

3. The method according to claim 1, wherein said first real coefficient all-pass filter all-pass filters and said second real coefficient all-pass filter are second-order all-pass filters.

4. The method according to claim 1, further comprising the steps of:
performing a frequency analysis on an observation signal of a plant;
calculating a warp parameter based on values of a high-frequency component and a low-frequency component after said step of performing said frequency analysis; and
setting calculated warp parameter in said first real coefficient all-pass filter all-pass filters and said second real coefficient all-pass filter.

5. A computer readable storage medium tangibly embodying a computer readable program code having computer readable instructions which when implemented, cause a computer to carry out the steps of a method comprising the steps of:
setting, by a processor of a computer system, $$x_{k+1} = f(x_k, k) + v_k, y_k = h(x_k, k) + n_k$$

wherein:
$x_k$ is an internal state;
$y_k$ is output;
$v_k$ is process noise for driving a system;
$n_k$ is observation noise;
$\bar{f}(\ )$ is a first given nonlinear function; and
$\bar{h}(\ )$ is a second given nonlinear function;
processing, by the processor, non-uniformed Unscented Kalman Filter to execute the steps of:
non-uniforming a phase duration of said $x_k$ by a first real coefficient all-pass filter in which a numerator and a denominator of a transfer function for z transform are described as having a relationship between mirror image polynomials; and
applying non-uniformed $x_k$ to $$x_{k+1} = \bar{f}(x_k, k) + v_k, y_k = \bar{h}(x_k, k) + n_k; \text{ and}$$

restoring, by the processor, non-uniformed phase duration of an estimated value of said $x_k$ calculated in said non-uniformed Unscented Kalman Filter to said phase duration by a second real coefficient all-pass filter in which a sign of a parameter in said first real coefficient all-pass filter is inverted.

6. The computer readable storage medium according to claim 5, wherein said first real coefficient all-pass filter all-pass filter and said second real coefficient all-pass filter are first-order all-pass filters.

7. The computer readable storage medium according to claim 5, wherein said first real coefficient all-pass filter all-pass filters and said second real coefficient all-pass filter are second-order all-pass filters.

8. The computer readable storage medium according to claim 5, further comprising the steps of:
performing a frequency analysis on an observation signal of a plant;
calculating a warp parameter based on values of a high-frequency component and a low-frequency component after said step of performing said frequency analysis; and
setting calculated warp parameter in said first real coefficient all-pass filter all-pass filters and said second real coefficient all-pass filter.

9. A system comprising:
an Unscented Kalman Filter; and
a processor device configured to:
non-uniform a phase duration of a signal outputted from a plant;
inputting said signal to said Unscented Kalman Filter; and
restore non-uniformed phase duration of an estimated value calculated in said Unscented Kalman Filter to said phase duration.

10. The system according to claim 9, further comprising:
real coefficient all-pass filters in which a numerator and a denominator of a transfer function for z transform are described as having a relationship between mirror image polynomials.

11. The system according to claim 10, wherein said real coefficient all-pass filters are first-order all-pass filters.

12. The system according to claim 10, wherein said real coefficient all-pass filters are second-order all-pass filters.

13. The system according to claim 10, wherein said processor device is further configured to:
perform a frequency analysis on an observation signal of a plant;
calculate a warp parameter based on values of a high-frequency component and a low-frequency component after performing said frequency analysis; and
set a calculated warp parameter in said all real coefficient all-pass filters.

* * * * *